US010319628B2

(12) United States Patent
Deprat et al.

(10) Patent No.: US 10,319,628 B2
(45) Date of Patent: Jun. 11, 2019

(54) INTEGRATED CIRCUIT HAVING A PLURALITY OF ACTIVE LAYERS AND METHOD OF FABRICATING THE SAME

(71) Applicant: Commissariat a l'energie atomique et aux energies alternatives, Paris (FR)

(72) Inventors: Fabien Deprat, Grenoble (FR); Perrine Batude, Dijon (FR); Laurent Brunet, Grenoble (FR); Claire Fenouillet-Beranger, Voiron (FR); Maud Vinet, Claix (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 15/715,619

(22) Filed: Sep. 26, 2017

(65) Prior Publication Data

US 2018/0090366 A1 Mar. 29, 2018

(30) Foreign Application Priority Data

Sep. 26, 2016 (FR) ...................................... 16 59020

(51) Int. Cl.
*H01L 21/768* (2006.01)
*H01L 21/311* (2006.01)
(Continued)

(52) U.S. Cl.
CPC .... *H01L 21/7682* (2013.01); *H01L 21/31116* (2013.01); *H01L 21/31144* (2013.01);
(Continued)

(58) Field of Classification Search
CPC ............. H01L 21/7682; H01L 27/0688; H01L 21/31144; H01L 23/528; H01L 23/5226;
(Continued)

(56) References Cited

U.S. PATENT DOCUMENTS 6,064,118 A * 5/2000 Sasaki ............... H01L 21/76802
257/750
6,413,852 B1 * 7/2002 Grill ................... H01L 21/7682
257/E21.576
(Continued)

FOREIGN PATENT DOCUMENTS

EP 0 872 887 A2 10/1998

OTHER PUBLICATIONS

French Preliminary Search Report dated Jun. 13, 2017 in French Application 16 59020, filed on Sep. 26, 2016 (with English Translation of Categories of cited documents & Written Opinion).

*Primary Examiner* — Marc Anthony Armand
*Assistant Examiner* — Sue Tang
(74) *Attorney, Agent, or Firm* — Oblon, McClelland, Maier & Neustadt, L.L.P.

(57) ABSTRACT

A method of fabrication of an integrated circuit is provided, including: providing a substrate including a first active layer and a first metallic level of interconnection arranged on top of the active layer and including first lines of interconnection separated by a first filling of sacrificial material; forming a superposition of an insulator layer and second lines of interconnection; providing access to the first filling through the insulator layer; filling the provided access with a second filling of sacrificial material; forming a second active layer on top of the second metallic level of interconnection; providing access to the second filling through the second active layer; and removing the first and the second fillings by a chemical etching through the provided access to the second filling.

10 Claims, 14 Drawing Sheets

(51) Int. Cl.
  *H01L 21/822* (2006.01)
  *H01L 23/522* (2006.01)
  *H01L 23/528* (2006.01)
  *H01L 23/532* (2006.01)
  *H01L 27/06* (2006.01)
  *H01L 21/3213* (2006.01)

(52) U.S. Cl.
  CPC .... *H01L 21/7685* (2013.01); *H01L 21/76807* (2013.01); *H01L 21/8221* (2013.01); *H01L 23/528* (2013.01); *H01L 23/5226* (2013.01); *H01L 23/53295* (2013.01); *H01L 27/0688* (2013.01); *H01L 21/32134* (2013.01); *H01L 21/32135* (2013.01); *H01L 21/7684* (2013.01); *H01L 21/76843* (2013.01)

(58) Field of Classification Search
  CPC ......... H01L 21/76807; H01L 21/31116; H01L 21/8221; H01L 21/7685; H01L 23/53295; H01L 21/76843; H01L 21/7684; H01L 21/32135; H01L 21/32134
  USPC .......................................................... 257/503
  See application file for complete search history.

(56) References Cited

U.S. PATENT DOCUMENTS

| | | |
|---|---|---|
| 2002/0025653 A1 | 2/2002 | Sasaki |
| 2002/0127844 A1 | 9/2002 | Grill et al. |
| 2002/0197761 A1* | 12/2002 | Patel .................. B81C 1/00476 438/52 |
| 2003/0173674 A1* | 9/2003 | Nakamura .......... H01L 21/7682 257/758 |
| 2008/0179750 A1 | 7/2008 | Arnal et al. |
| 2010/0323477 A1 | 12/2010 | Arnal et al. |
| 2016/0111330 A1 | 4/2016 | Fenouillet-Beranger et al. |
| 2017/0062392 A1* | 3/2017 | Cheng ................ H01L 23/5384 |

* cited by examiner

Fig. 20
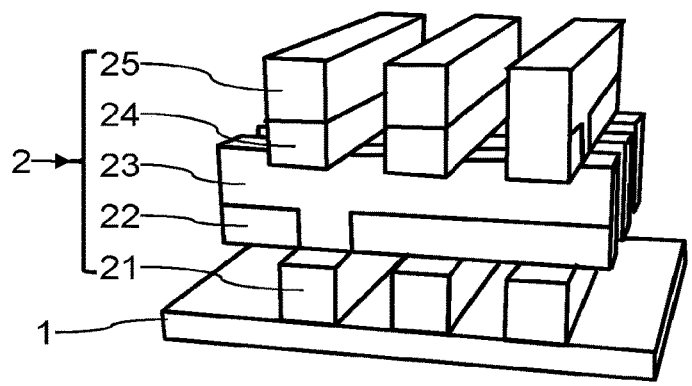
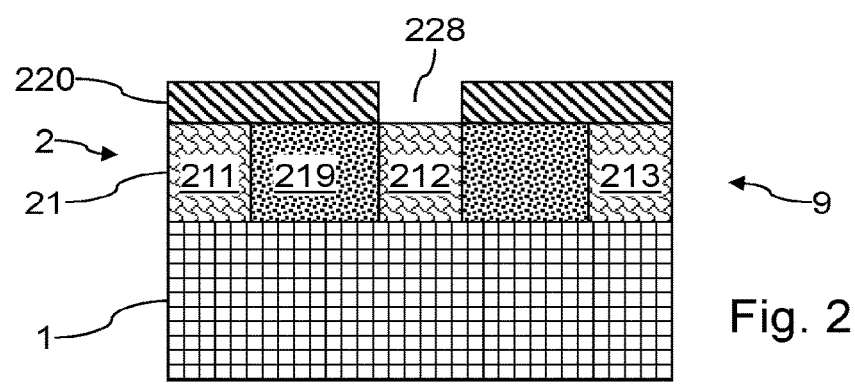
Fig. 21
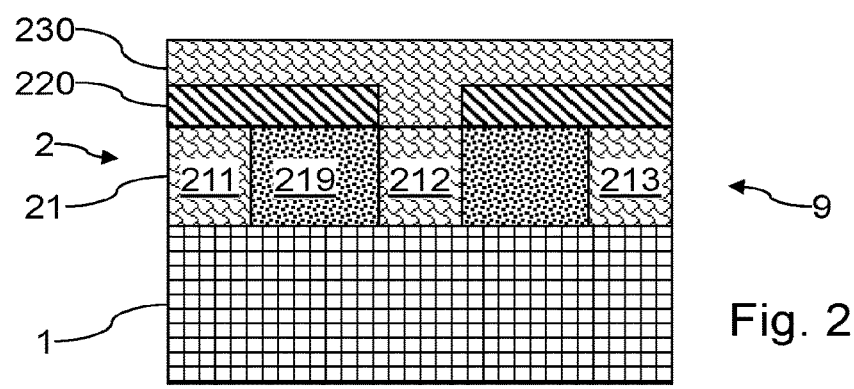
Fig. 22

INTEGRATED CIRCUIT HAVING A PLURALITY OF ACTIVE LAYERS AND METHOD OF FABRICATING THE SAME

The invention concerns integrated circuits comprising a plurality of active layers of electronic components, called 3D-type integrated circuits, and in particular such integrated circuits comprising air gaps used as insulator between lines of interconnection.

In order to reduce the cost of integrated circuits and boost their performance, manufacturers have constantly been reducing the size of the transistors, increasing their number per chip, and increasing the number of circuits produced in parallel. In order to allow this boosting of performance of the integrated circuits, the engineers have thus geometrically decreased the dimensions of the transistors of the active portion as well as the dimensions of the interconnections. However, these improvements have the consequence of amplifying the parasitic effects associated with the transistors and the interconnections.

The formation of the lines of interconnection for small-sized technological nodes must deal with an increase in the signal propagation time through these lines of interconnection. The propagation times are basically proportional to a product RC, where R is the resistance of the line of interconnection and C is the capacitance between the line of interconnection and its environment. The smaller the size of the technological node, the closer together are the lines of interconnection and the larger the capacitance created. Depending on the size of the integrated circuits, studies have revealed that the capacitance of a line of interconnection was the cause of more than 80% of the propagation time. Furthermore, increasing the density of integration tends to increase the length of the interconnections serving to connect the different components of the active layer.

In order to reduce the capacitance between the lines of interconnection, the patent U.S. Pat. No. 5,641,712 proposed producing cavities between the lines of interconnection of one level of metallization of an interconnection layer designed for an active layer. These cavities are encapsulated in a nonconformal deposition of insulator, so as to preserve air gaps between the lines of interconnection. The air gaps make it possible to reduce the coefficient of permittivity between the lines of interconnection, so that the capacitances of these lines of interconnection on one and the same level of metallization are reduced.

According to another method of fabrication described in patent U.S. Pat. No. 7,126,223, a sacrificial layer is formed between the lines of interconnection of one level of metallization of an interconnection layer. This sacrificial layer is formed in a thermal sacrificial material which evaporates when heated to a sufficient temperature. The interconnection layer is covered by a porous diffusion layer. After a heating step, the sacrificial layer is evaporated. The gas generated by the evaporation is evacuated via the diffusion layer. Air gaps are then devised between the lines of interconnection of one and the same level of metallization. The air gaps make it possible to reduce the coefficient of permittivity between the lines of interconnection, so that the capacitances of these lines of interconnection are reduced.

In order to increase the density of integration and/or shorten the distance between the electronic components, it is known to perform a 3D integration by superposing a second active layer of electronic components on the interconnection layer of the first active layer. The interconnection layer of the first active layer then becomes an intermediate interconnection layer.

The methods previously described are not compatible with the formation of a second active layer by a 3D integration on an intermediate interconnection layer comprising air gaps between the lines of interconnection. In these two methods, the air gaps weaken too much the mechanical strength of the intermediate interconnection layer. Some of the lines of interconnection are bent excessively, with a risk of forming short circuits with the lines of interconnection of adjacent levels of metallization. Furthermore, the mechanical strength of the intermediate interconnection layer proves inadequate to withstand the mechanical stresses caused by certain steps of the fabrication method, such as abrasion.

Moreover, in the previously described methods any heating step involved in the formation of a second active layer on the intermediate interconnection layer results in a high risk of degradation of the integrated circuit. In effect, the gas present in the gaps between the lines of interconnection is trapped between the first and second active layers. During a heating, the pressure of the air in the air gaps increases in proportion to the rise in its temperature. This excess pressure may result in simple degradation of the integrated circuit impacting its performance, or in a dislocation of the wafer used to form the integrated circuit. This excess pressure has more and more harmful consequences the more the mechanical strength of the interconnection layer is weakened by the air gaps.

The invention aims to solve one or more of these drawbacks. In particular, the invention aims to take advantage of an integrated circuit able to withstand heating steps during the formation of another active layer and able to withstand the mechanical stresses of various steps in the process of fabrication. Thus, the invention relates to a method of fabrication of an integrated circuit as defined in the enclosed claims. The invention also relates to an integrated circuit, as defined in the enclosed claims.

Other characteristics and advantages of the invention will emerge clearly from the following description given thereof as an in no way limiting illustration, with reference to the enclosed drawings, in which:

FIG. 20 is a perspective view of one example of an interconnection layer of an integrated circuit according to the invention;

FIGS. 21 to 26 illustrate steps for another variant of the method of fabrication, using a damascening technique;

The invention proposes to form a superpositioning of an insulator layer and lines of interconnection on the lines of interconnection of a lower metallic level of interconnection separated by a filling of sacrificial material, this lower metallic level of interconnection being devised on an active layer of electronic components. One forms accesses to the sacrificial filling through the superpositioning. One then fills these accesses by another filling of sacrificial material. One then forms another active layer of electronic components by devising an access to the fillings of sacrificial material and by chemically etching these fillings through this access.

Such a method makes it possible at the same time to form air gaps between the lines of interconnection of one and the same level of metallization in order to reduce the parasitic capacitances and to guarantee a mechanical strength of the interconnection layer formed between the active layers, due to the presence of the layer of insulation between the lines of interconnection of the two levels of metallization.

FIGS. 1 to 15 illustrate different steps of an example of a method of fabrication of an integrated circuit 9 according to one embodiment of the invention, using a technique of double damascening. FIGS. 1 to 15 are cross-sectional views of the integrated circuit 9 at different steps of its process of fabrication. The integrated circuit 9 formed includes transistors in its active layers. Such an integrated circuit 9 may of course include other types of electronic components in its active layers. Other components, such as MEMS structures, may likewise be included.

Figure 1:
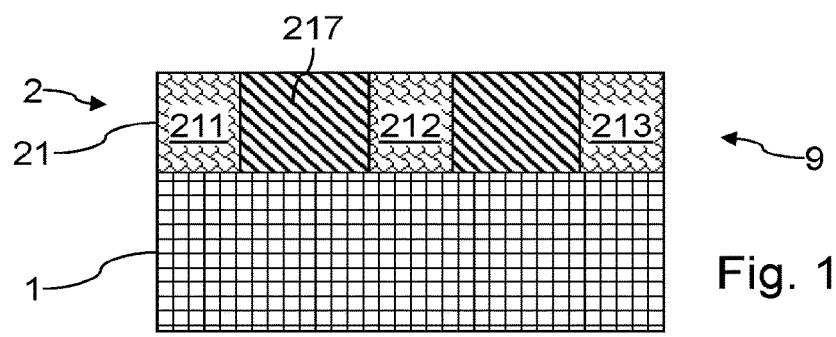
FIGS. 1 to 15 illustrate different steps of an example of a method of fabrication of an integrated circuit according to one embodiment of the invention, using a double damascening technique.

In FIG. 1, one provides a substrate comprising an active layer 1 having electronic components, not illustrated. An interconnection layer 2 in the process of formation comprises a level of metallization 21, formed on the active layer 1. An intermediate metallization layer, not illustrated, may be interposed between the interconnection layer 2 and the active layer 1. This intermediate metallization layer can be realized in SiCN, for example.

The level of metallization 21 comprises lines of interconnection 211, 212 and 213 electrically connected to electronic components of the active layer 1. The lines of interconnection 211, 212 and 213 may be realized, for example, with a metal chosen from the group made up of Cu, Co, W, Al, and Ag, for example with a barrier chosen from the group made up of Ti, TiN, Ta, TaN, Co, and CoW. The lines of interconnection 211, 212 and 213 may likewise be realized, for example, with silicides of the following materials: Ni, NiPt, NiCo, NiCoW, $TiSi_2$, $WSi_2$ and PtSi.

The lines of interconnection 211, 212 and 213 are separated by a dielectric filling 217 resulting from previous steps of the method of fabrication of the integrated circuit 9. The dielectric filling 217 may be, for example, made of Ultra Low K (ULK) oxide, which is a material with very low permittivity, SiCN, or a stack of different dielectrics (for example, a stack of an oxide and a nitride). For example, thanks to a prior step of mechanochemical polishing, the filling 217 and the lines of interconnection 211, 212 and 213 may have flush upper faces.

Figure 2:
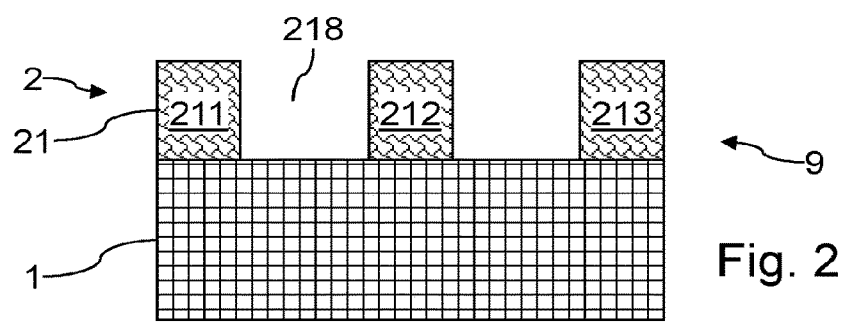

In FIG. 2, one removes the dielectric filling 217 to form cavities 218 between the lines of interconnection 211, 212 and 213. The removal of the dielectric filling 217 can be done in a manner known in itself to the person skilled in the art, for example, by dry etching or by wet etching. Such an etching may, of course, be selective with respect to the material of the lines of interconnection 211, 212 and 213, and with respect to the material of the active layer accessible through the cavities 218. For example, starting with lines of interconnection 211, 212 and 213 formed on a nitride layer of the active layer 1, lines of interconnection 211, 212 and 213 made of W, with a barrier comprising a superpositioning of Ti and TiN, with a dielectric filling 217 of $SiO_2$, the cavities 218 may be formed by a dry etching in a capacitive coupling chamber with a fluorocarbon chemistry.

Figure 3:
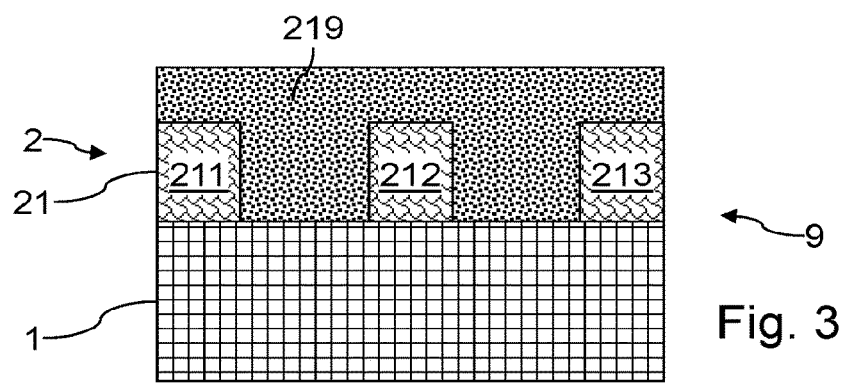

In FIG. 3, one forms a sacrificial material 219 inside the cavities 218. In particular, the sacrificial material 219 is deposited in order to fill the cavities 218. The sacrificial material 219 is deposited here until it covers the lines of interconnection 211, 212 and 213. The sacrificial material 219 is advantageously a semiconductor, such as SiGe or Si, for example polysilicon, poly SiGe, or amorphous Si, whose methods of deposition are known in themselves.

Figure 4:
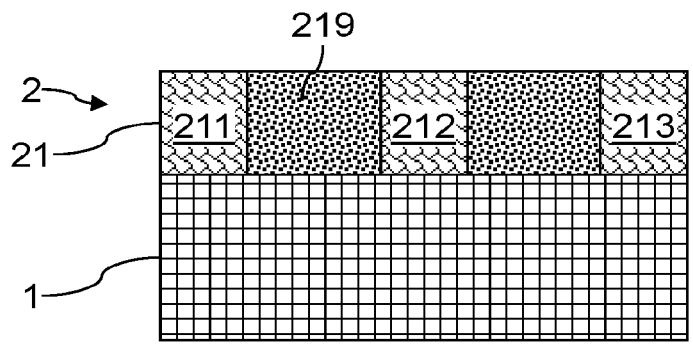

In FIG. 4, one performs a step of mechanochemical polishing of the sacrificial material 219, stopping at the lines of interconnection 211, 212 and 213 of the level of metallization 21. The sacrificial material 219 is thus preserved in the cavities between the lines of interconnection 211, 212 and 213.

Figure 5:
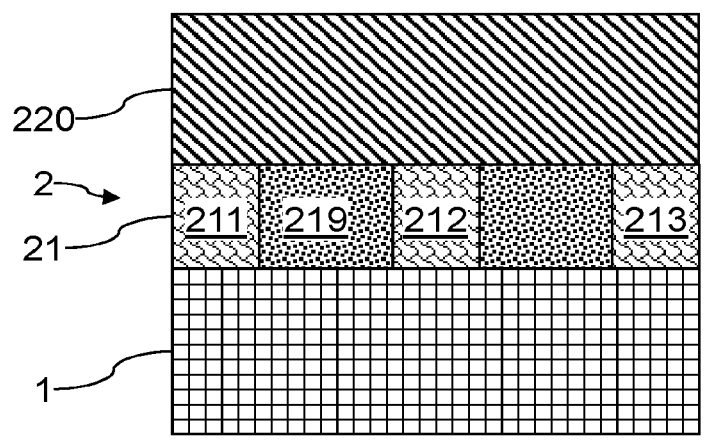

In FIG. 5, one forms a dielectric layer 220 on the level of metallization 21 including the lines of interconnection 211, 212 and 213 and the sacrificial material 219. The dielectric layer 220 may have the same composition as the dielectric filling 217. The dielectric layer 220 may likewise comprise a superpositioning of layers of different materials, such as a layer of SiCN deposited on the level of metallization 21, a layer of ULK oxide deposited on the layer of SiCN, and a layer of TEOS deposited on the layer of ULK oxide.

Figure 6:
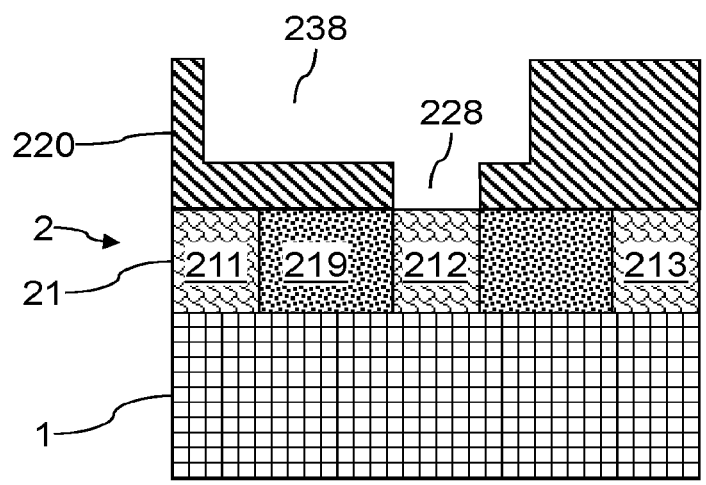

In FIG. 6, steps of photolithography and etching of the dielectric layer 220 have been performed. A hole 228 is thus formed through the dielectric layer 220, in order to devise an access to the line of interconnection 212. The hole 228 is for example devised in the thickness of a layer of SiCN of the dielectric layer 220. A cavity 238 is formed in the upper portion of the dielectric layer 220. The cavity 238 communicates with the hole 228. In the cross-sectional view of FIG. 6, the dielectric layer 220 is preserved directly above the lines of interconnection 211 and 213, and directly above the sacrificial material 219. The etchings may be, for example, anisotropic dry type etching in a capacitive coupling chamber with a fluorocarbon chemistry.

Figure 7:
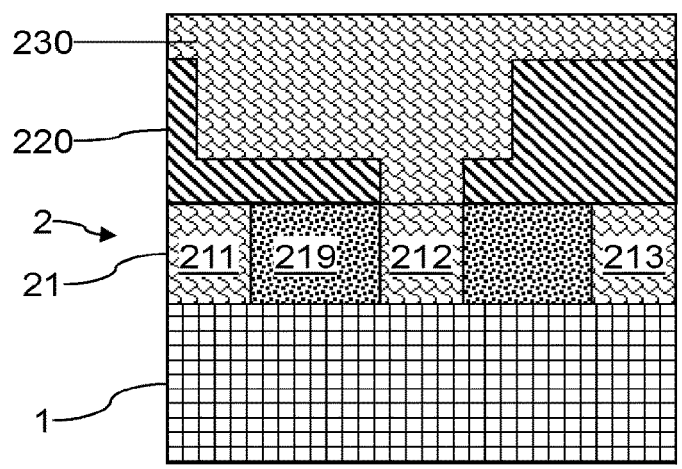

In FIG. 7, a metallization is done in order to fill the hole 228 and the cavity 238. The metallization here involves the depositing of a metallic layer 230 by a technique of double damascening. The metallic deposition may involve the depositing of a metal chosen from the group made up of Cu, Co, W, Al, and Ag. The metallic deposition may be preceded by the formation of a barrier (not represented) chosen from the group made up of Ti, TiN, Ta, TaN, Co, and CoW. The metallic deposition may likewise be realized by using silicides of the following materials: Ni, NiPt, NiCo, NiCoW, $TiSi_2$, $WSi_2$ and PtSi. The metallization here is realized such that the metallic layer 230 covers the entire dielectric layer 220.

Figure 8:
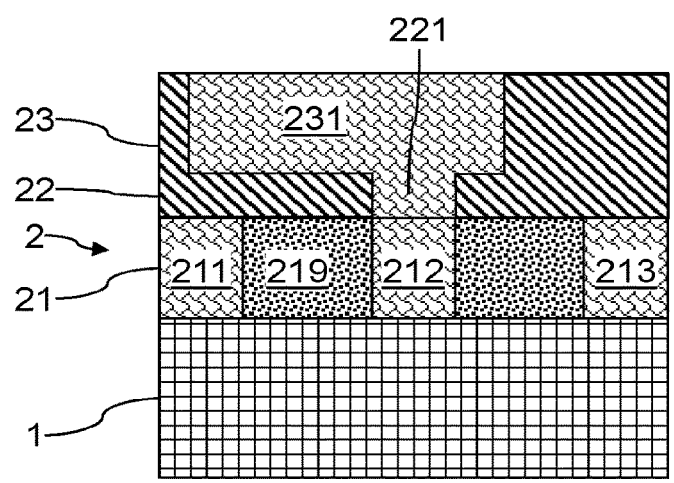

In FIG. 8, one performs a step of mechanochemical polishing of the metallic layer 230, stopping at the dielectric layer 220. The metallic layer is thus preserved in the hole 228 to form a via 221. The via 221 is thus formed in an intermediate metallization layer 22. The metallic layer is likewise preserved in the cavity 238 to form a line of interconnection 231. The line of interconnection 231 is thus formed in a level of metallization 23. The line of interconnection 231 is electrically connected to the line of interconnection 212 by means of the via 221. The interconnection layer 2 comprises at this stage the level of metallization 21, the intermediate metallization layer 22, and the level of metallization 23. The intermediate metallization layer 22 here includes a portion of the dielectric layer 220, especially that arranged beneath the line of interconnection 231.

Figure 9:
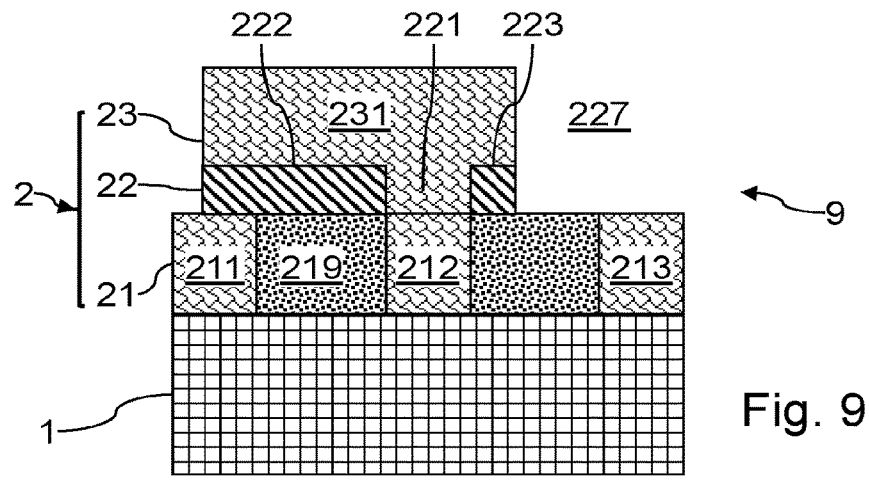

In FIG. 9, one performs an etching of the dielectric layer 220. The etching is done in particular to form an access 227 to the sacrificial material 219, through the intermediate metallization layer and through the level of metallization 23. The etching is likewise done to remove the dielectric layer 220 between the different lines of interconnection of the level of metallization 23. The etching is for example of anisotropic type, and may utilize the lines of interconnection of the level of metallization 23 as a hard mask for this etching. Beneath the lines of interconnection of the level of metallization 23 one thus forms supports which are self-aligned with these lines of interconnection. Such supports in the intermediate metallization layer 22 ensure a mechanical bond between the lines of interconnection of the level of metallization 23 and the lines of interconnection of the level of metallization 21. The self-alignment between the supports and the lines of interconnection advantageously allows an optimizing of the resulting mechanical bond. In the example illustrated, posts 222 and 223 form supports beneath the line of interconnection 231. As the supports are made of dielectric material, they likewise ensure an electrical insulation between the lines of interconnection of the level of metallization 23 and the lines of interconnection of the level of realization 21.

The etching, for example, may be a dry type etching. The etching is selective with respect to the material present in the lines of interconnection and with respect to the sacrificial filling 219.

Figure 10:
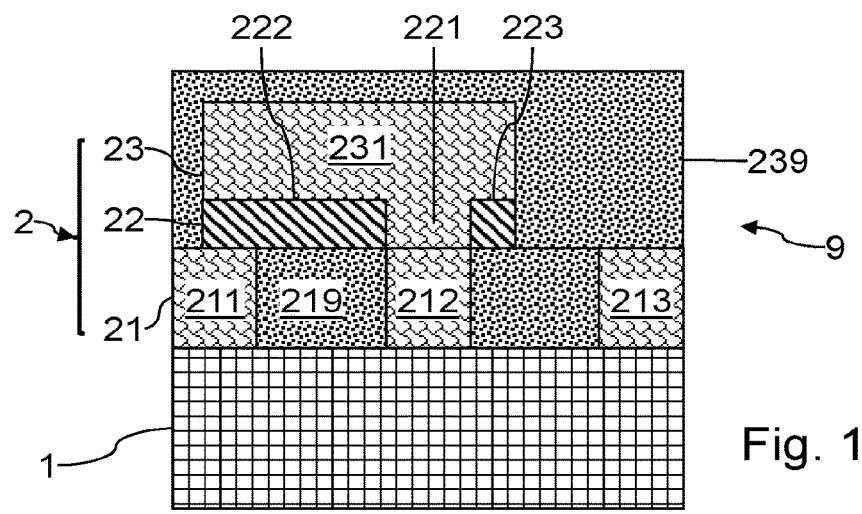

In FIG. 10, a sacrificial material 239 is formed inside accesses 227. In particular, the sacrificial material 239 is deposited in order to fill the accesses 227, and in order to fill the spaces between the different lines of interconnection of the level of metallization 23. The sacrificial material 239 here is deposited until it covers the line of interconnection 231. The sacrificial material 239 is advantageously identical to the sacrificial material 219. The sacrificial material 239 is for example a semiconductor, such as SiGe or Si, for example polysilicon, poly SiGe, or amorphous Si.

Figure 11:
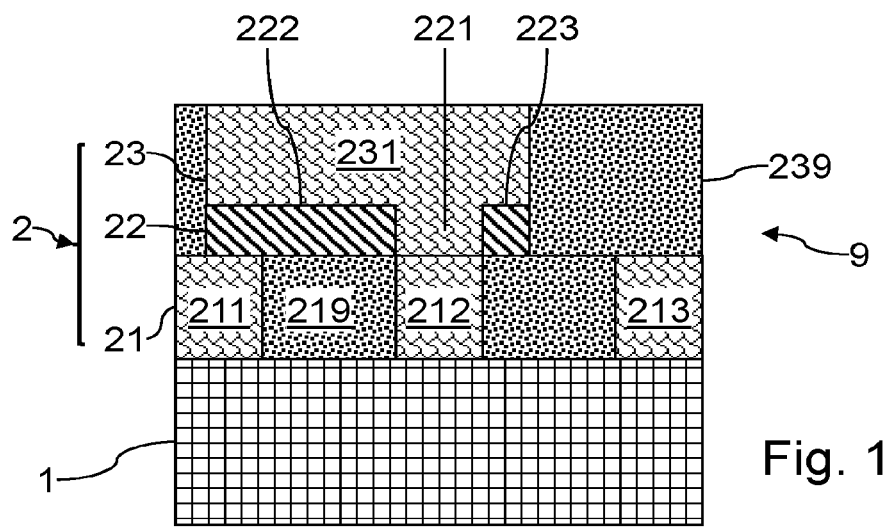

In FIG. 11, one performs a step of mechanochemical polishing of the sacrificial material 239, stopping at the line of interconnection 231 of the level of metallization 23. The sacrificial material 239 is thus preserved in the spaces between the lines of interconnection of the level of metallization 23, and between the supports of the intermediate metallization layer 22. The sacrificial material 239 is in contact with the sacrificial material 219 in the area of the accesses 227 which have been filled.

Figure 12:
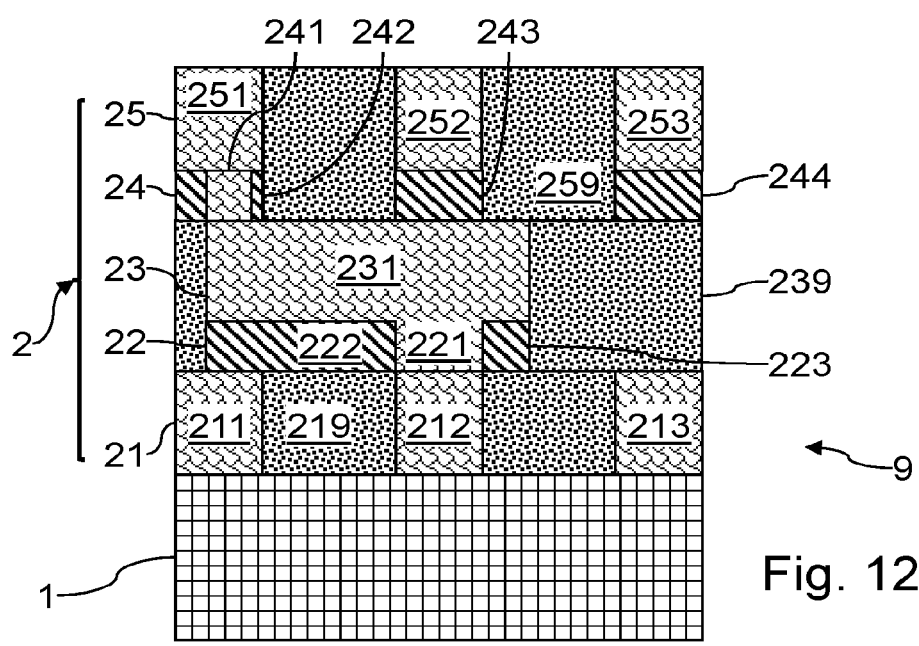

In FIG. 12, by similar methods, an intermediate metallization layer 24 has been formed on the level of metallization 23, and a level of metallization 25 on the intermediate metallization layer 24. The level of metallization 25 comprises in particular lines of interconnection 251, 252 and 253. A sacrificial material 259 is devised in the spaces between the lines of interconnection of the level of metallization 25. The intermediate metallization layer 24 here comprises supports 242, 243 and 244 made of dielectric material. The supports 242, 243 and 244 are formed respectively directly above the lines of interconnection 251, 252 and 253. The supports 242, 243 and 244 constitute posts ensuring a mechanical bond between the lines of interconnection of the level of metallization 25 and the lines of interconnection of the level of metallization 23. The supports likewise ensure an electrical insulation between the lines of interconnection of the level of metallization 25 and the lines of interconnection of the level of metallization 23. The supports of the intermediate metallization layer 24 are self-aligned with the lines of interconnection of the level of metallization 25. In the example illustrated, a via 241 is devised in the intermediate metallization layer 24 through the support 242, so as to electrically connect the line of interconnection 251 and the line of interconnection 231. The sacrificial material 259 fills the spaces between the supports of the intermediate metallization layer 24. The sacrificial material 259 fills accesses to the sacrificial material 239, and is thus in contact with the sacrificial material 239. The upper faces of the lines of interconnection of the level of metallization 25 are accessible so as to be able to realise further interconnections. The interconnection layer 2 here comprises the levels of metallization 21, 23 and 25, and the intermediate metallization layers 22 and 24. Other levels of metallization and intermediate interconnection layers may be added by using the various steps previously explained.

Figure 13:
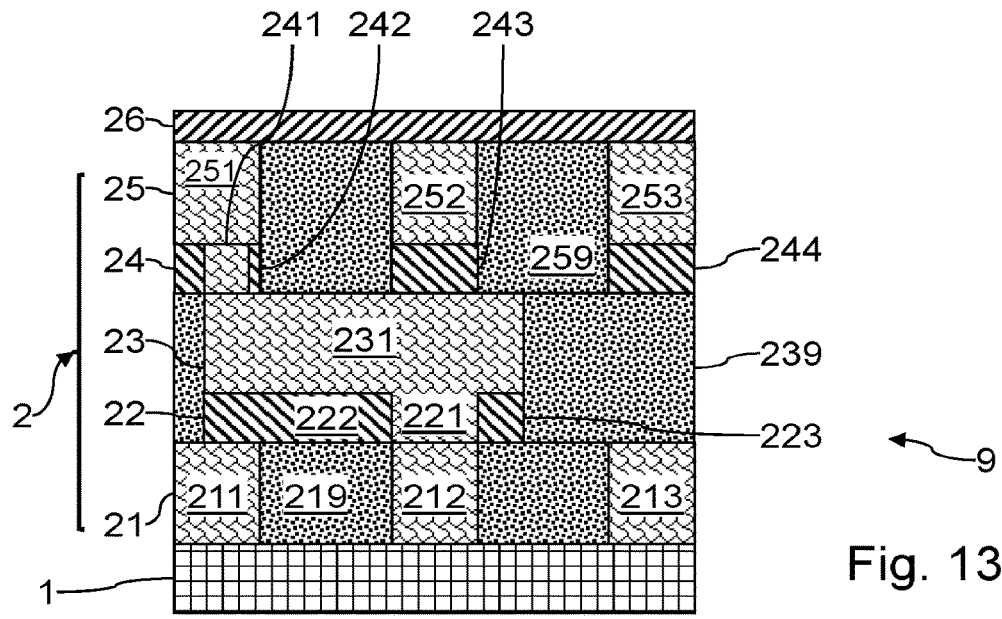

In FIG. 13, a dielectric layer 26 is formed on the level of metallization 25. The dielectric layer 26 can be realized, for example, in SiN.

Figure 14:
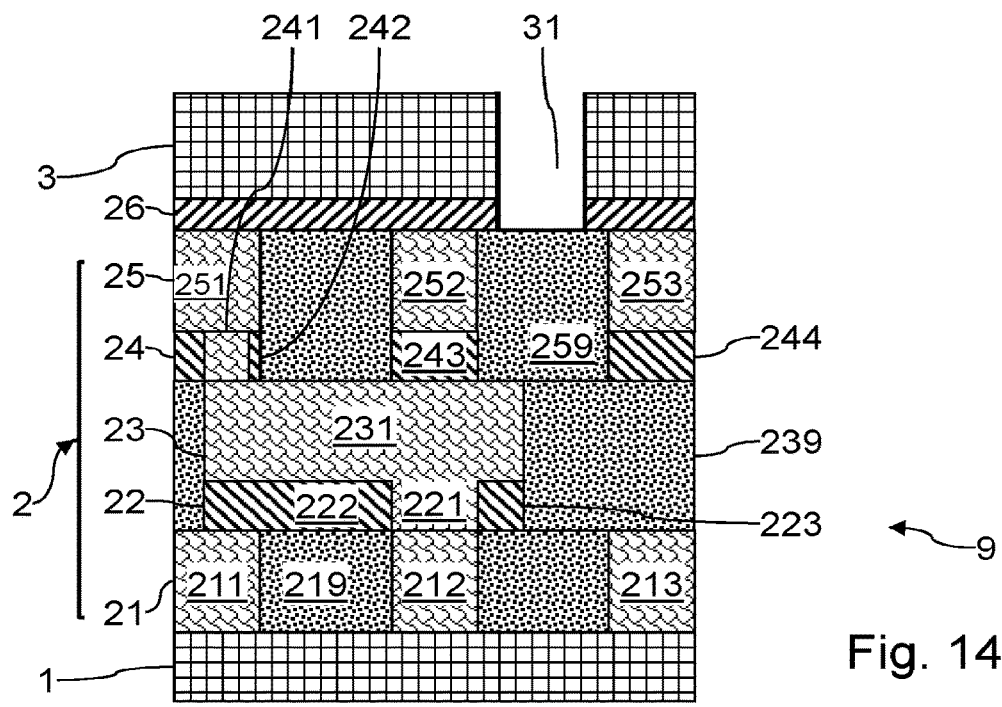

In FIG. 14, another layer of electronic components 3 has been formed on the dielectric layer 26. The interconnection layer 2 thus indeed forms an intermediate interconnection layer, in an integrated circuit 9 having a 3D integration. An access 31 is formed through the layer 3 and through the dielectric layer 26. The access 31 emerges onto the sacrificial material 259. Accesses 31 can be realized in sufficient quantity to afford sufficient access to the sacrificial material 259 for its later removal. The accesses 31 can be realized by anisotropic dry etching, in a way known in itself to the skilled person.

Figure 15:
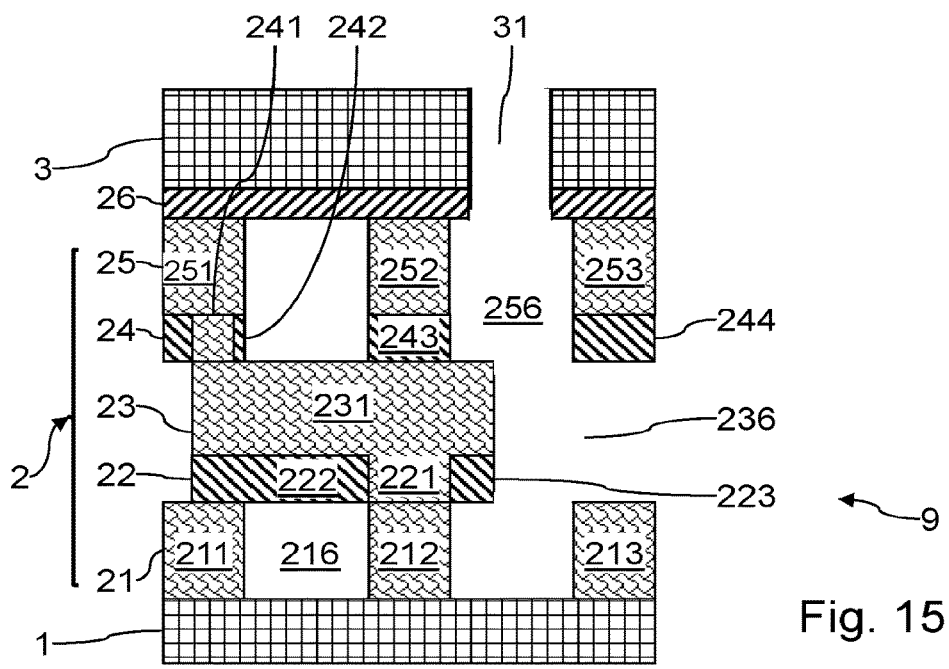

In FIG. 15, the sacrificial material has been removed in the interconnection layer 2. Thus, the sacrificial material 219, the sacrificial material 239, and the sacrificial material 259 have been removed. The removal of the sacrificial material is done by a chemical etching through the accesses 31. This etching is selective with respect to the material(s) of the lines of interconnection and the supports of the different levels of metallization and the different intermediate metallization layers. A sacrificial material of polysilicon may be removed, for example, by a wet TMAH etching when the lines of interconnection are made of copper and comprise a barrier of Ta/TaN. One may also perform a dry etching for removal of a sacrificial material of silicon in the interconnection layer 2, for example, a dry etching with $XeF_2$ in the vapour phase.

FIG. 20 is a perspective view enabling better discerning of the structure of an interconnection layer 2 at the end of the removal of the sacrificial material therefrom.

Figure 34:
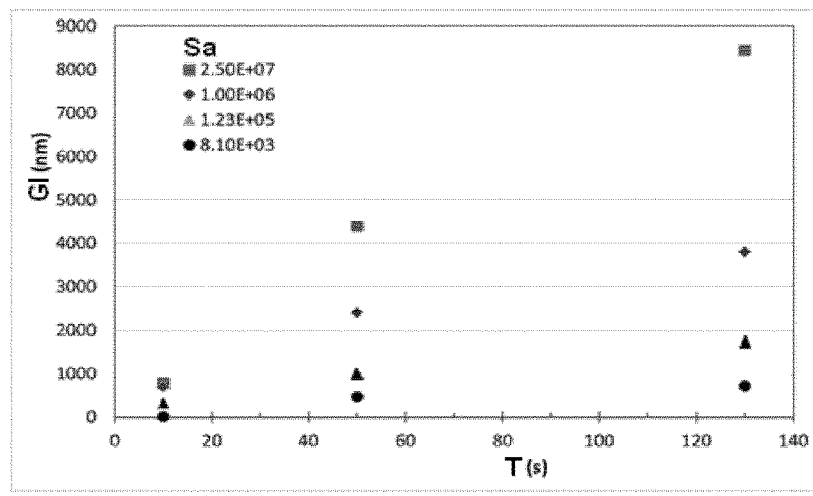
FIGS. 34 and 35 are diagrams illustrating respectively the lateral etching distance of the sacrificial material, and the necessary access density, as a function of various parameters.

FIG. 34 illustrates an example of a lateral etching distance GI of a sacrificial material of Si by $XeF_2$, as a function of the cross section Sa of an access 31 and the etching time Tg. This diagram has been produced for accesses 31 of square or circular shape.

Figure 35:
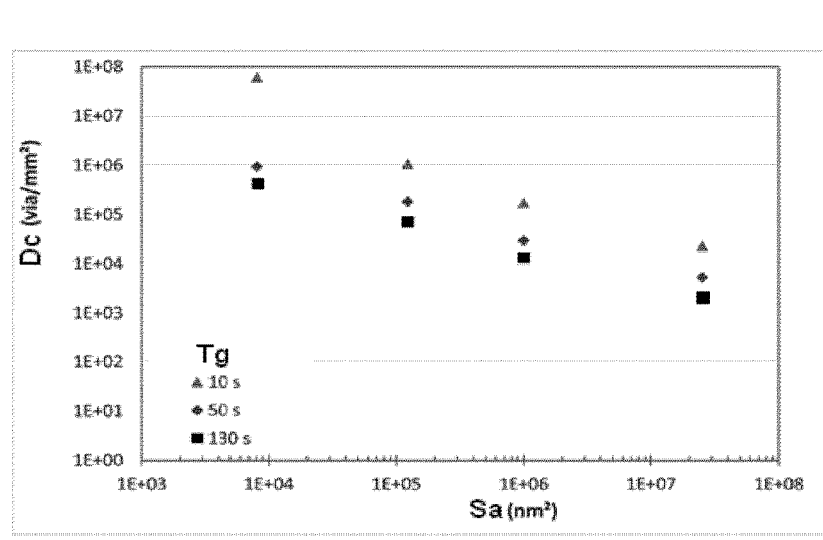

FIG. 35 illustrates the necessary access density Dc 31, as a function of the etching time Tg of the sacrificial material of Si by $XeF_2$, and as a function of the cross section Sa of each access 31. This diagram has been produced for accesses 31 of square or circular shape.

The integrated circuit 9 formed therefore has air gaps separating the lines of interconnection in each of the levels of metallization. The capacitances of the lines of interconnection in these different levels of metallization are thus reduced. The integrated circuit 9 comprises in particular:

air gaps 216 separating the lines of interconnection 211, 212 and 213 of the metallic level 21;

air gaps 236 separating the lines of interconnection of the metallic level 23;

air gaps 256 separating the lines of interconnection 251, 252 and 253 of the metallic level 25.

One may note that the supports of the lines of interconnection only modestly alter the capacitances of the lines of interconnection, these capacitances being induced predominantly between lines of interconnection of one and the same level of metallization, rather than between lines of interconnection of different levels of metallization.

The integrated circuit 9 formed comprises supports ensuring a mechanical bond between the lines of interconnection of the adjacent metallic levels. The integrated circuit 9 will thus have a sufficient mechanical strength for the performance of a certain number of steps of its fabrication method, such as abrasion steps, without risk of an alteration of its functionalities.

According to this fabrication method, the sacrificial material of the interconnection layer 2 is only removed after the formation of the active layer 3. Thus, the heating steps during the formation of the active layer 3 do not cause an excess pressure, in the prior absence of air gaps in the interconnection layer 2.

The use of a semiconductor sacrificial material makes it possible to perform more easily its selective chemical etching with respect to the metallic material of the lines of interconnection and with respect to the dielectric material of the supports, or of the layers of separation with the active layers 1 and 3.

Furthermore, a known method of 3D integration consists in bringing together the active layer 3 with the interconnection layer 2 by means of a bonding interface, usually including an oxide layer. A semiconductor sacrificial material likewise easily enables a selective etching of the sacrificial material to be performed with respect to this bonding interface, which it is important not to destroy.

In the example illustrated, the lines of interconnection of two adjacent levels of metallization are perpendicular. The invention, of course, also applies to adjacent levels of metallization having parallel lines of interconnection.

Figure 16:
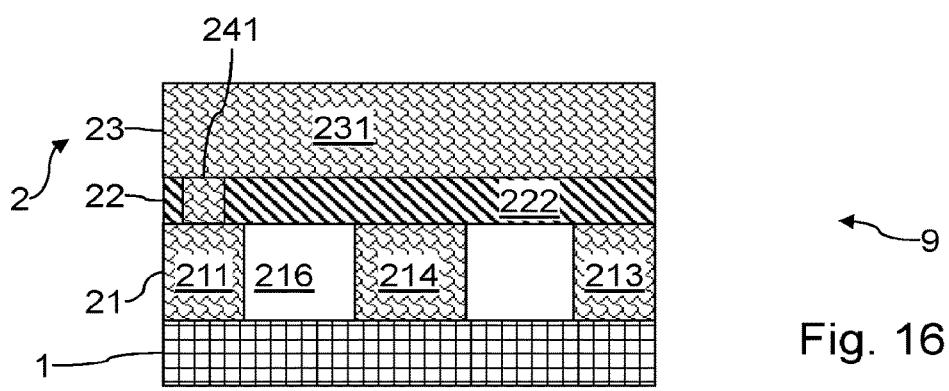
FIG. 16 illustrates one variant involving a dummy line of interconnection utilized as a support for the lines of interconnection of other levels of metallization.

FIG. 16 illustrates one variant of the previously explained method of fabrication. The cross-sectional view of FIG. 16 corresponds to the stage of the fabrication method illustrated with reference to FIG. 9.

When the distance separating the lines of interconnection of one metallic level seems to be too great to provide a sufficient bending strength for the upper metallic level, this variant proposes devising one or more dummy or nonfunctional lines of interconnection between functional lines of interconnection. Thus, in the example, the lines of interconnection 211 and 213 are functional and are connected either to other lines of interconnection or to electronic components of the active layer. In order to improve the bending strength of the line of interconnection 231, a dummy line of interconnection 214 is positioned between the lines of interconnection 211 and 213.

Figure 17:
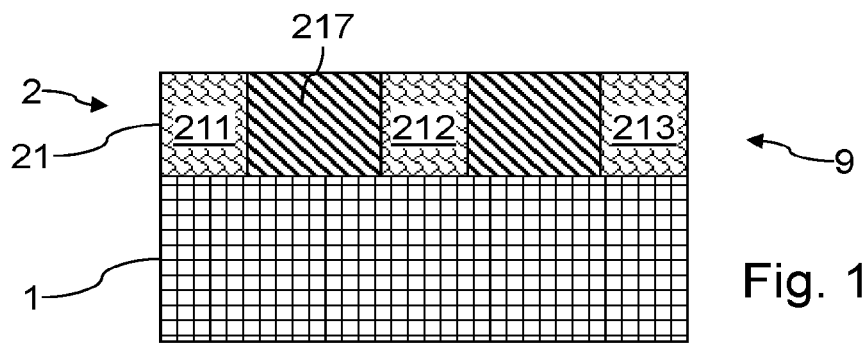
FIGS. 17 to 19 illustrate steps for one variant of the method of fabrication.
Figure 18:
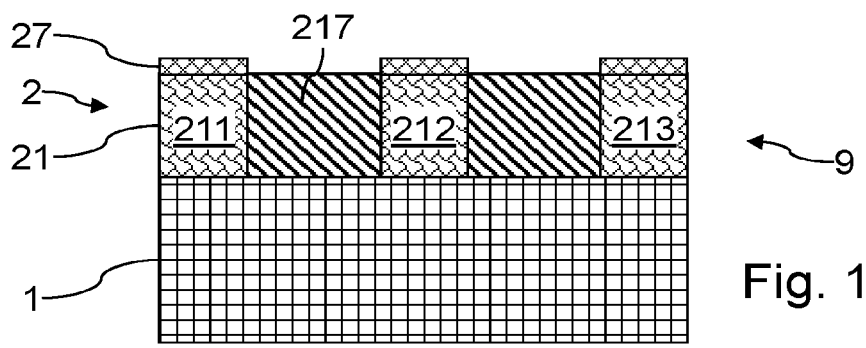
Figure 19:
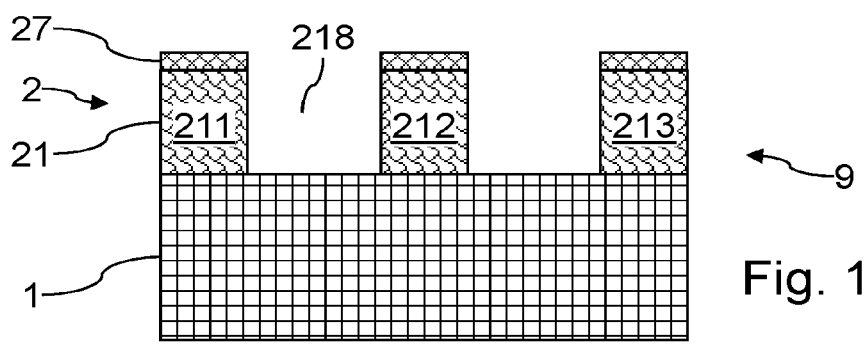

FIGS. 17 to 19 illustrate steps for one variant of the method of fabrication. The steps described with reference to FIGS. 17 to 19 will replace, for example, steps described with reference to FIGS. 1 and 2.

In FIG. 17, the substrate provided is identical to the one provided in reference to FIG. 1. The lines of interconnection 211, 212 and 213 are thus separated by a dielectric filling 217.

In FIG. 18, a conductive protection 27 is formed on the lines of interconnection 211, 212 and 213. This protection makes it possible, in a manner known in itself, to protect the upper face of the lines of interconnection 211, 212 and 213, against later steps of the fabrication method. The formation of a conductive protection 27 makes it possible to guarantee, in the event of only partial removal of this conductive protection 27, the possibility of preserving an electrical contact with the lines of interconnection. The conductive protection 27 may, for example, be deposited by electroplating on the lines of interconnection, or by photolithography and etching. For example, a protection 27 made of CoWP may be deposited by electroplating on copper lines of interconnection.

In FIG. 19, the dielectric filling 217 is removed to form cavities 218 between the lines of interconnection 211, 212 and 213. The conductive protection 27 may advantageously be preserved before continuing with the later steps of the fabrication method.

FIGS. 21 to 26 illustrate different steps of one example of a fabrication method for an integrated circuit 9 according to another embodiment of the invention, using a technique of damascening to produce the level of metallization 23. This method typically starts at the end of the step illustrated in FIG. 4 for the embodiment previously described.

In FIG. 21, a dielectric layer 220 is formed on the level of metallization 21 including the lines of interconnection 211, 212 and 213 and the sacrificial material 219. The dielectric layer 220 may have the same composition as in the previously described embodiment. One proceeds with steps of photolithography and etching of the dielectric layer 220 to form a hole 228 through the latter. One thus devises an access to the line of interconnection 212. The dielectric layer 220 is preserved directly above the lines of interconnection 211 and 213, and directly above the sacrificial material 219.

In FIG. 22, a metallization is performed so as to fill the hole 228. The metallization here involves the depositing of a metallic layer 230. The metallic layer 230 may have the same composition as in the previously described embodiment. The metallic layer 230 may have a barrier as described in the previous embodiment. The metallization here is done so that the metallic layer 230 covers all of the dielectric layer 220.

Figure 23:
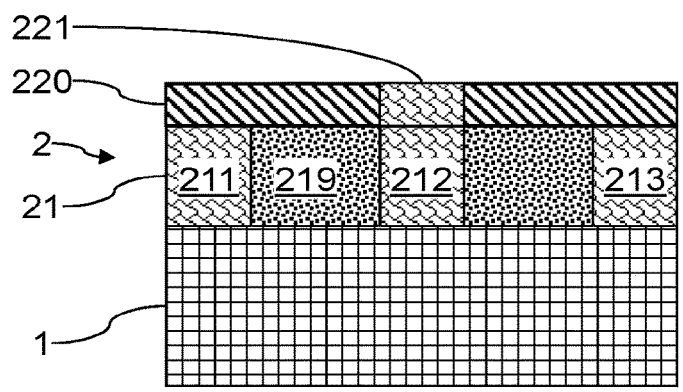

In FIG. 23, one carries out a step of mechanochemical polishing of the metallic layer 230, stopping at the dielectric layer 220. The metallic layer is thus preserved in the hole 228 to form a via 221. The via 221 is thus formed in an intermediate metallization layer 22.

Figure 24:
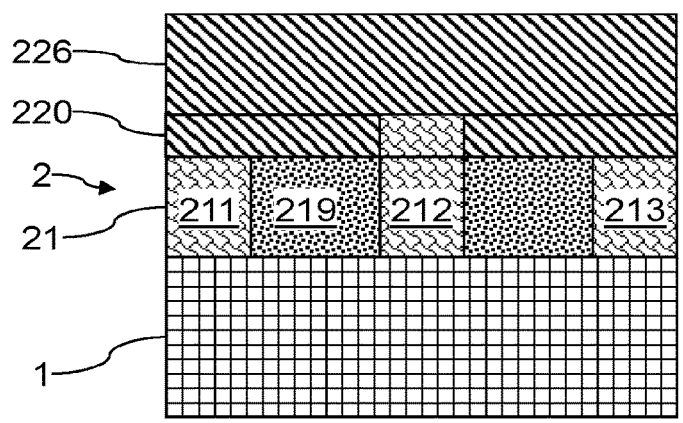

In FIG. 24, a dielectric layer 226 is formed, covering the dielectric layer 220 and the via 221. The dielectric layer 226 may have the same composition as the dielectric layer 220.

Figure 25:
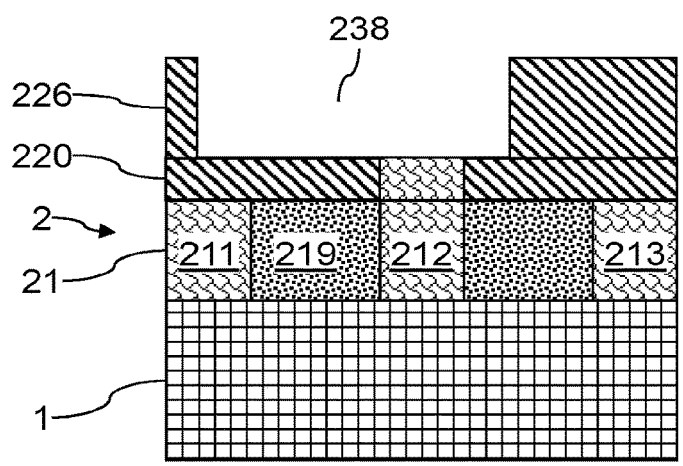

In FIG. 25, one performs steps of photolithography and etching of the dielectric layer 226, stopping at the via 221. A cavity 238 is formed in the dielectric layer 226. The cavity 238 communicates with the via 221.

Figure 26:
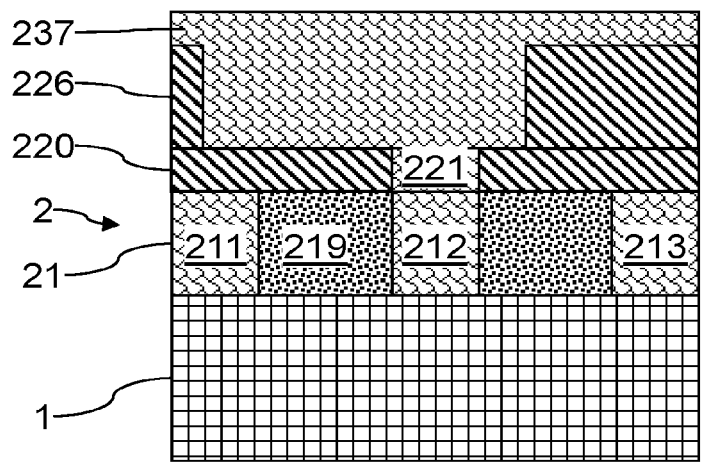

In FIG. 26, a metallization is performed so as to fill the cavity 238. The metallization here involves the depositing of a metallic layer 237. The metallic layer 237 may have the same composition as the metallic layer 230. The metallization here is done so that the metallic layer 237 covers the entire dielectric layer 226 and fills the cavity 238. At this stage, the integrated circuit 9 basically has the structure of the integrated circuit 9 illustrated in FIG. 7. The method of fabrication of the integrated circuit 9 may be continued as described with reference to FIGS. 8 to 15, and then include for example a step of mechanochemical polishing and a removal of dielectric.

FIGS. 27 to 33 illustrate different steps of an example of a method of fabrication of an integrated circuit 9 according to another embodiment of the invention, using a technique of MESA etching to realize the level of metallization 23. This method typically commences at the end of the step illustrated in FIG. 4 for the previously described embodiment.

Figure 27:
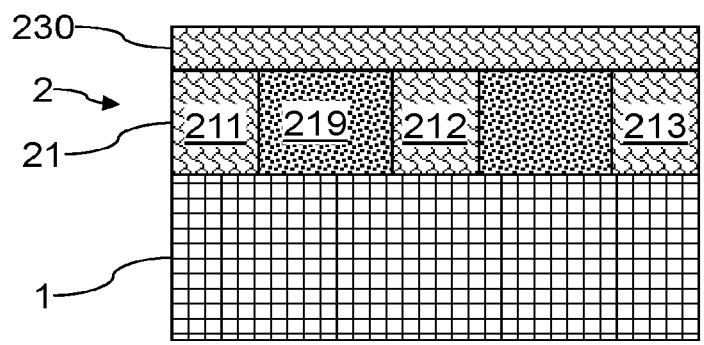
FIGS. 27 to 33 illustrate steps for another variant of a method of fabrication, utilizing a MESA etching technique.

In FIG. 27, a full sheet metallization is performed. The metallization here involves the depositing of a metallic layer 230. The metallic layer 230 may have the same composition as in the previously described embodiments. The metallic layer 230 may have a barrier as described in the preceding embodiments. The metallization is done here so that the metallic layer 230 covers the entire level of metallization 21.

Figure 28:
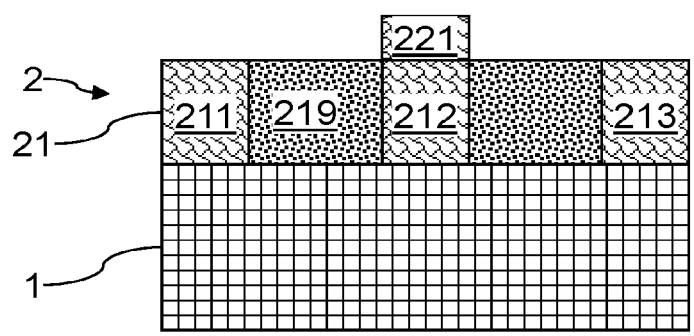

In FIG. 28, one performs steps of photolithography and etching of the metallic layer 230, to form a via 221 on the line of interconnection 212. One furthermore exposes the lines of interconnection 211 and 213, as well as the sacrificial material 219.

Figure 29:
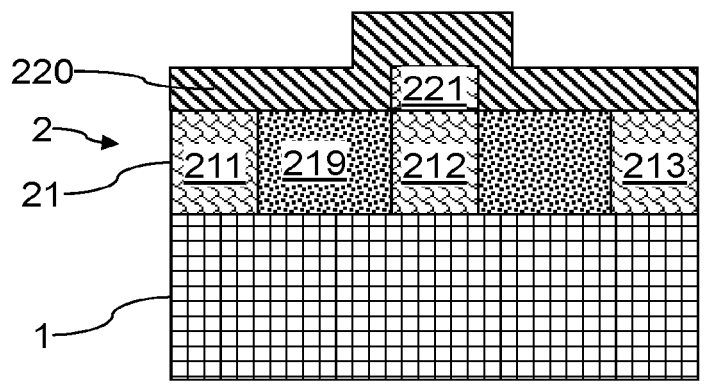

In FIG. 29, a dielectric layer 220 is formed, typically an isotropic deposition. The dielectric layer 220 is formed in a full sheet on the via 221, on the lines of interconnection 211 and 213, and on the sacrificial material 219. The dielectric layer 220 may have the same composition as in the preceding embodiments.

Figure 30:
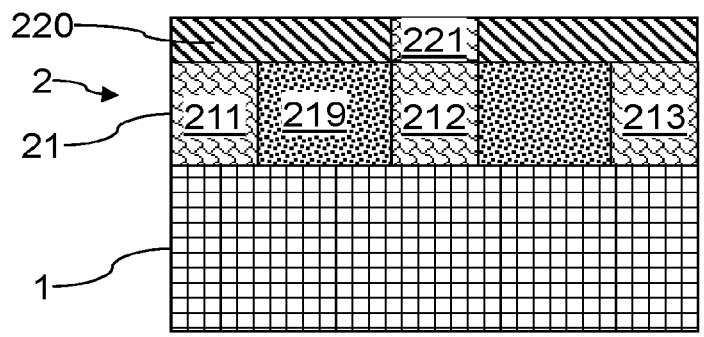

In FIG. 30, a step of mechanochemical polishing is performed on the dielectric layer 220, stopping at the via 221.

Figure 31:
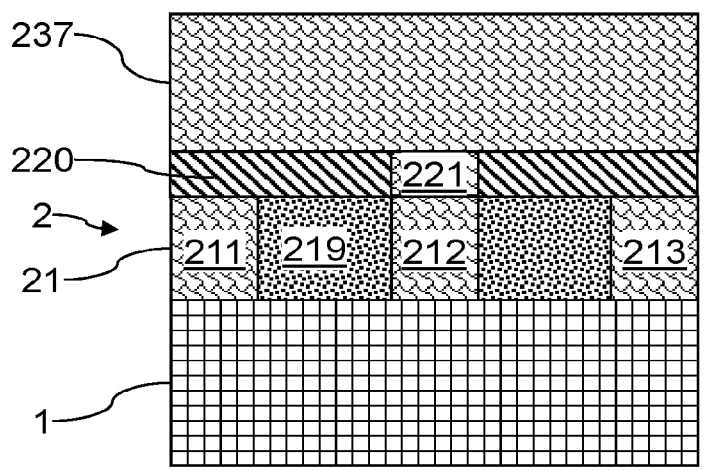

In FIG. 31, a full sheet metallization is performed, covering the via 221 and the dielectric layer 220. The metallization here comprises the depositing of a metallic layer 237. The metallic layer 237 may have the same composition as the metallic layer 230.

Figure 32:
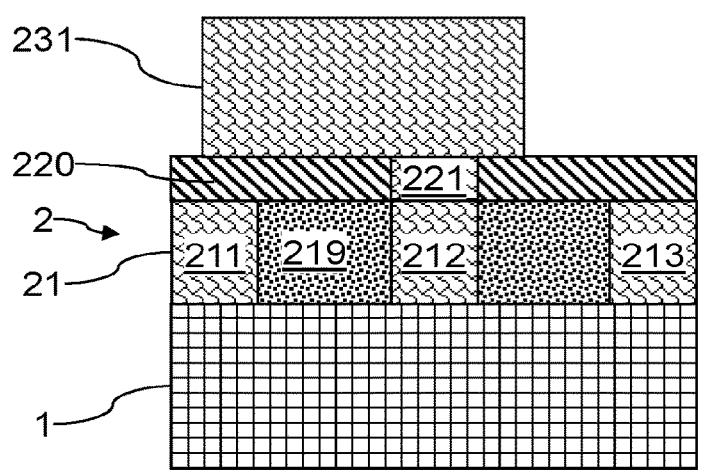

In FIG. 32, steps of photolithography and etching of the metallic layer 237 are performed, in order to form the line of interconnection 231. The etching stops at the dielectric layer 220.

Figure 33:
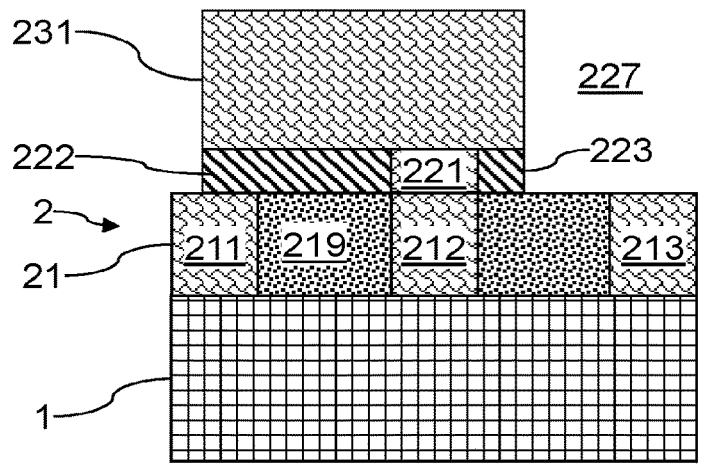

In FIG. 33, etching of the dielectric layer 220 is done, using the line of interconnection 231 as hard mask. One thus forms an access 227 to the sacrificial material 219. One also forms supports which are self-aligned with the line of interconnection 231, here posts 222 and 223. The method of fabrication of the integrated circuit 9 may be continued as described with reference to FIGS. 10 to 15.

Despite a self-aligning with the lines of interconnection, supports produced according to the invention may have (especially due to unwanted effects of etching steps carried out during the fabrication process):
  a width not constant over their height (that is, a non-rectangular cross section). When the supports have a cross section with curved lateral cavities, these cavities will advantageously have a radius of curvature at most equal to 10% of the width of the line of interconnection being supported; and/or
  a mean width less than that of the lines of interconnection which they are supporting.

The sacrificial materials are chosen to have a temperature of evaporation or destruction greater than the temperatures used during the different steps of the fabrication method prior to their removal. The sacrificial materials are thus preserved so as not to form air gaps in the intermediate interconnection layer prior to the opening of accesses 31 through the active layer 3.

The invention claimed is:

1. A method of fabricating an integrated circuit, comprising:
   providing a substrate comprising a first active layer of electronic components and a first metallic level of interconnection disposed on top of the first active layer and comprising first lines of interconnection separated by a first filling of sacrificial material;
   forming, on the first metallic level of interconnection, a superposition of an insulator layer and second lines of interconnection of a second metallic level of interconnection;
   providing a first access to the first filling through the insulator layer and through the second metallic level of interconnection;
   filling the provided first access with a second filling of sacrificial material, such that the second filling is in contact with the first filling;
   forming a second active layer of electronic components on top of the second metallic level of interconnection;
   providing a second access to the second filling through the second active layer; and
   removing the first and the second fillings, which are in contact with each other, by a chemical etching through the provided second access to the second filling, the removing being performed after the forming of the second active layer.

2. The method of fabricating an integrated circuit according to claim 1, wherein the step of providing the first access to the first filling comprises etching of the insulator layer by using the second lines of interconnection as a hard mask.

3. The method of fabricating an integrated circuit according to claim 1, further comprising forming at least one via electrically connecting a first line of interconnection to a second line of interconnection.

4. The method of fabricating an integrated circuit according to claim 1, wherein the second lines of interconnection extend along a direction that is perpendicular to another direction in which the first lines of interconnection extend, the first and the second directions each extending in a respective plane that is parallel to an upper surface of the substrate.

5. The method of fabricating an integrated circuit according to claim 1, wherein materials of the first filling and the second filling of sacrificial material have a thermal evaporation budget greater than a thermal budget of steps of the fabrication method carried out up to the removing of the first filling and the second filling.

6. The method of fabricating an integrated circuit according to claim 1, wherein materials of the first filling and the second filling of sacrificial material are chosen from the group made up of amorphous silicon, silicon germanium, and polysilicon.

7. The method of fabricating an integrated circuit according to claim 1, wherein the insulator layer is preserved beneath the second lines of interconnection at an end of the removing of the first filling and the second filling by the chemical etching.

8. The method of fabricating an integrated circuit according to claim 1, comprising previous steps of:
   providing the substrate comprising the first active layer of electronic components and the first metallic level of interconnection disposed on top of the first active layer and comprising the first lines of interconnection separated by a dielectric material;
   forming conductive protections on an upper face of the first lines of interconnection;
   removing the dielectric material to provide cavities between the first lines of interconnection; and
   filling the cavities between the first lines of interconnection with the first filling of sacrificial material.

9. The method of fabricating an integrated circuit according to claim 1, wherein the first lines of interconnection are a dummy line of interconnection, or the second lines of interconnection are a dummy line of interconnection, or the first lines and the second lines of interconnection are dummy lines of interconnection.

10. The method of fabricating an integrated circuit according to claim 1, wherein the providing the first access comprises forming insulating supports between the first lines of interconnection and the second lines of interconnection.

* * * * *